United States Patent [19]

Ingold

[11] Patent Number: 5,475,773
[45] Date of Patent: Dec. 12, 1995

[54] FIBER-OPTIC QUARTZ VOLTAGE SENSOR

[75] Inventor: Mathias Ingold, Unterengstringen, Switzerland

[73] Assignee: ABB Research Ltd., Baden, Switzerland

[21] Appl. No.: 232,098

[22] PCT Filed: Sep. 2, 1993

[86] PCT No.: PCT/CH93/00216
    § 371 Date: Apr. 29, 1994
    § 102(e) Date: Apr. 29, 1994

[87] PCT Pub. No.: WO94/06025
    PCT Pub. Date: Mar. 17, 1994

[30] Foreign Application Priority Data

Sep. 3, 1992 [DE] Germany .................. 42 29 449.5

[51] Int. Cl.$^6$ ............................................... G02B 6/26
[52] U.S. Cl. ................................................ 385/12; 385/38
[58] Field of Search ........................... 385/12, 13, 147; 250/227.14, 227.17; 356/345

[56] References Cited

U.S. PATENT DOCUMENTS

| | | | |
|---|---|---|---|
| 3,766,616 | 10/1973 | Staudte | 29/22.35 |
| 4,148,530 | 4/1979 | Calderara | 310/361 |
| 4,319,186 | 3/1982 | Kingsley | 385/12 |
| 4,447,753 | 5/1984 | Ochiai | 310/312 |
| 4,453,105 | 6/1984 | Kogure | 310/361 |
| 4,477,723 | 10/1984 | Carome et al. | 250/227.19 |
| 4,503,353 | 3/1985 | Hermann | 310/361 |
| 4,524,322 | 6/1985 | Bobb | 324/72 |
| 4,729,622 | 3/1988 | Pavlath | 356/350 |
| 4,735,506 | 4/1988 | Pavlath | 356/350 |
| 4,929,830 | 3/1990 | Bohnert et al. | 250/227.14 |
| 4,939,447 | 7/1990 | Bohnert et al. | 250/227.14 |
| 5,053,693 | 10/1991 | Bohnert et al. | 324/96 |

FOREIGN PATENT DOCUMENTS

| | | |
|---|---|---|
| 0316635A1 | 5/1989 | European Pat. Off. . |
| 0316619A1 | 5/1989 | European Pat. Off. . |
| 433824A1 | 6/1991 | European Pat. Off. . |
| 2856183 | 7/1980 | Germany . |
| 4025911A1 | 4/1991 | Germany . |

OTHER PUBLICATIONS

Toute L'Electronique, C. Picot, Feb. 1974, pp. 27–32.
Toute L'Electronique, C. Picot, Apr. 1974, pp. 79–83.
K. M. Bohnert and J. Nehring, Fiber–optic sensing of electric field components, vol. 27, No. 23, pp. 4814–4818, Dec. 1, 1988.
K. Bohnert and J. Nehring, Fiber–optic sensing of voltages by line integration of the electric, vol. 14, No. 5, pp. 290–292, Mar. 1, 1989, S.290 ff.; 1,–4–7.
J. Nye; Physical Properties of Crystals, pp. 125–126; 1957 (no month).
J. C. Brice, Crystals for quartz resonators, Reviews of Modern Physics, vol. 57, No. 1, Jan. 1985.
B. Y. Kim et al., Use of highly elliptical core fibers for two–mode fiber devices, 1987, Optical Society of America. (no month).
J. Tichy et al., Piezoelektrische MeBtechnik, Berlin, N.Y. 1980 (no month).

Primary Examiner—Rodney B. Bovernick
Attorney, Agent, or Firm—Burns, Doane, Swecker & Mathis

[57] ABSTRACT

The sensor comprises at least one quartz body (1) sectioned from a quartz crystal, an optical fiber connected to the quartz body in at least one given length, and means for detecting changes in length of the optical fiber which are caused by piezoelectrically caused changes in shape of the quartz body in an electric field. It is shown how the mostly undesired temperature dependence of the sensor measurement signal can be influenced and, as the case may be, even eliminated in a purely passive manner by a mixture of the two independent piezoelectric coefficients $d_{11}$ and $d_{14}$ which contribute to the piezoelectrically caused change in dimension of the quartz body.

10 Claims, 7 Drawing Sheets

FIBER-OPTIC QUARTZ VOLTAGE SENSOR

BACKGROUND OF THE INVENTION

1. Field of the Invention

The present invention relates to a fiber-optic sensor for measuring electric field strengths or voltages and having a quartz body in accordance with the preamble of claim 1.

2. Discussion of Background

Fiber-optic sensors of this type are disclosed, for example, in EP-A1-0,316,619, EP-A1-0,316,635 and EP-A1-0,433,824, as well as in K. Bohnert, J. Nehring, Appl. Opt. 27, (1988), pages 4814–4818 or K. Bohnert, J. Nehring, Opt. Lett. 14, (1989), pages 290–292.

In the known sensors, the measurement principle is based on the fact that a circular disk which is made from a piezoelectric material (for example, quartz) and wound around with an optical fiber experiences in the electric or E-field a change in circumference which can be measured interferometrically by the resulting change in length of the optical fiber. In this case, it is chiefly the two-mode interferometer which has proved itself as a simple type of interferometer, cf. B. Y. Kim et al., Opt. Lett. 12, (1987), pages 729–731. The signal acquisition is performed, for example, by compensating the differential phase shift which is to be measured between the fiber modes.

Quartz is very well suited as a piezoelectric sensor material, because it has a sufficiently large piezoelectric effect and a small dielectric constant. Furthermore, quartz disks which are cut at right angles to the crystallographic x-axis (definition of axis in accordance with IRE Standard 1949, see further below) can be used for selective measurement of E-field components in the x-direction, that is to say to form the scalar product (E, x). By winding such a quartz body, which extends in the x-direction from the ground electrode to the high-voltage electrode, in an approximately uniform fashion extended along the cylinder axis in the x-direction, or by connecting in series a plurality of such quartz disks along an arbitrary integration path between ground and the high-voltage electrode, it being the case that the x-axis is aligned tangentially to the integration path and all the quartz disks are wound approximately uniformly with a continuous fiber, it is possible to approximate the line integral of the electric field $$\int E \, dx$$

and thus to measure the voltage independently of the E-field distribution (EP-A1-0,316,619, EP-A1-0,316,635).

For measurement signal compensation, use is mostly made of a piezoelectric ceramic cylinder (EP-A1-0,433,824) whose piezoelectric effects are at least two orders of magnitude stronger by comparison with quartz and thereby permit a substantial step-down in voltage.

It has proved to be disadvantageous in the known sensors that their measurement sensitivity exhibits a disturbing temperature dependence. A decrease in the measurement signal by typically a few percent is found between −20° C. and +70° C. with the type of fiber mostly used to date. The reasons for this are, on the one hand, the temperature dependences of piezoelectric coefficients and, on the other hand, the temperature dependences of the fiber interferometer.

It has been proposed in EP-A1-0,433,824 to eliminate the temperature dependence by producing the piezoelectric sensor and the compensator from the same material and keeping them at the same temperature. The temperature-induced falsification of the measurement signal (E-field or electric voltage) is actively eliminated or reduced in this case, which requires a not inconsiderable outlay on apparatus and control.

Manifold quartz sections are known from the chronological industry, where quartz crystal oscillators are used for the purpose of frequency stabilization in order to compensate for the temperature dependence of the piezoelectric resonant frequency of the crystals in the 1st, 2nd or 3rd order (cf., for example, J. C. Brice, Review of Modern Physics 57 (1), (1985) pages 105–146; U.S. Pat. No. 3,766,616; U.S. Pat. No. 4,503,353; U.S. Pat. No. 4,447,753; U.S. Pat. No. 4,453,105). In the fiber-optic sensor considered here, however, the issue is not the temperature dependence of a resonant frequency of a quartz crystal oscillator, but how a change in the dimension of a quartz body which is caused piezoelectrically is converted into a change in length of a length of an optical fiber connected to it, and the temperature dependence of this effect.

SUMMARY OF THE INVENTION

Accordingly, one object of the invention as defined in claim 1 is to eliminate or at least partially compensate the temperature dependence of the measurement signal in a fiber-optic sensor of the type mentioned at the beginning in a purely passive manner.

The invention takes account of the fact that, because of its crystal symmetry, quartz has (only) two independent piezoelectric coefficients. These are, as will be explained in more detail later, the coefficients $d_{11}$ and $d_{14}$. Their temperature dependences directly oppose one another. The coefficient $d_{11}$ decreases with increasing temperature by approximately 2% per 100K; the coefficient $d_{14}$ increases by approximately 13% per 100K (cf. J. Tichy, G. Gautschi, "Piezoelektrische Messtechnik" ("Piezoelectric Metrology"), Springer Verlag Berlin, Heidelberg, New York (1950), pages 100–106, with further references). This opposing temperature dependence of the two independent coefficients is exploited by the invention. Whereas in the known sensors exclusive use has previously been made of the coefficient $d_{11}$ in order to obtain the measurement signal, the invention proposes to influence the temperature dependence of the measurement signal (E-field or electric voltage) by mixing the two independent coefficients in a desired way.

Within the framework of the concept of a solution according to the invention, various mixtures of the two independent coefficients are possible, since it is possible to influence the temperature dependence of the measurement signal with regard to different criteria. The targeted aim need not in this case of necessity be the complete elimination of the temperature dependence of the deformation of the quartz body which is caused piezoelectrically and is to be transmitted to the optical fibers. In particular, the targeted aim can consist in eliminating or at least partially compensating the temperature dependence of the entire sensor, that is to say including the detection means (interferometer). Furthermore, within the framework of the concept of the solution according to the invention, different geometries are also possible with respect to the crystallographic orientation and shape of the quartz body and/or the arrangement of one or more optical fiber sections thereon. Certain geometries additionally require a specific orientation of the quartz body in the electric field to be measured. Instead of only one quartz body, it is possible, in particular, to use a plurality of quartz bodies in combination with one another. A few preferred embodiments are characterized in the dependent claims.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
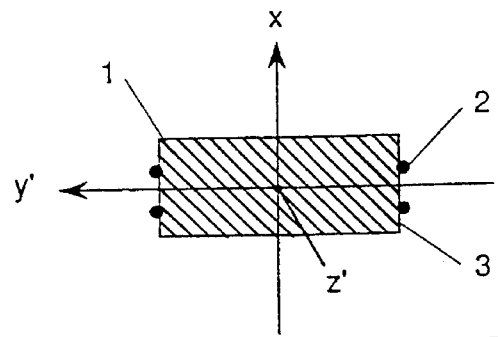
FIGS. 1 show under a) and b) two views of a cylindrical quartz body having an elliptical cross section, in accordance with a first embodiment of the invention.

A linear relationship between the components $E_k$ of the electric field vector E and the components, describing the change in dimension, of the strain tensor $s_{ij}$ in accordance with $$s_{ij} = \sum_K d_{kij} \cdot E_k. \tag{1}$$

holds for the change in dimension which a piezoelectric crystal experiences due to the inverse piezoelectric effect in an electric field. The total of 27 piezoelectric coefficients $d_{kij}$ form the piezoelectric tensor, which is a third-order tensor and is symmetric with respect to i and j. At most 18 of the 27 coefficients are independent on the basis of this symmetry. By substituting the indices i and j as follows with only a single index $$\begin{array}{cccccc} ij: & 11 & 22 & 33 & 23,32 & 31,13 & 12,21 \\ l: & 1 & 2 & 3 & 4 & 5 & 6 \end{array},$$

it is possible to write the piezoelectric tensor clearly in a matrix-like form (contracted notation):

$$d_{kl} = \begin{array}{cccccc} d_{11} & d_{12} & d_{13} & d_{14} & d_{15} & d_{16} \\ d_{21} & d_{22} & d_{23} & d_{24} & d_{25} & d_{26} \\ d_{31} & d_{32} & d_{33} & d_{34} & d_{35} & d_{36} \end{array} \tag{2}$$

it being the case in accordance with convention (see J. F. Nye, "Physical Properties of Crystals", pages 125 and 126, Oxford University Press, London and New York (1957)) that $d_{kl} = d_{kii}$ (i, l=1, 2, 3) and $d_{kl} = 2 \cdot d_{kij}$ (i≠j; i, j=1, 2, 3; l=4, 5, 6).

Turning, now, to a special piezoelectric crystal, it is possible on the basis of the symmetries of the crystal under consideration to eliminate further coefficients from this scheme of 18. For quartz, to which alone the following statements refer, the result is the following special scheme for the piezoelectric tensor in constricted notation using only the two independent piezoelectric coefficients $d_{11}$ and $d_{14}$ already mentioned:

$$d_{kl} = \begin{array}{cccccc} d_{11} & -d_{11} & 0 & d_{14} & 0 & 0 \\ 0 & 0 & 0 & 0 & -d_{14} & -2d_{11} \\ 0 & 0 & 0 & 0 & 0 & 0 \end{array}. \tag{3}$$

The IRE Standard 1949 (cf. the publication, mentioned at the beginning, by J. Tichy, G. Gautschi, "Piezoelektrische Messtechnik" ("Piezoelectric Metrology"), page 103, Springer-Verlag Berlin, Heidelberg, New York (1980); J. F. Nye, "Physical Properties of Crystals", page 125, Oxford University Press, London and New York (1975)) provided the basis in this case for the orientation of the crystallographic axes (x, y, z) of the crystal. This standard lays down that for right quartz and for left quartz a right-handed coordinate system is applied uniformly, with the x-axis in the direction of one of three twofold electric axes and with the z-axis (threefold axis) in the direction of the optical axis of the crystal. Right quartz (left quartz) is defined as a quartz which when looking back into the light source turns the polarization plane of linearly polarized light in the clockwise (counterclockwise) direction. The positive x-axis points towards where in the event of strain in the left quartz along the x-axis a positive charge is produced by the direct piezoelectric effect. In the case of a right quartz, a negative charge is produced. With this choice of the coordinate system, the coefficients $d_{11}$ and $d_{14}$ always have the same sign, specifically both "+" for left quartz and both "−" for right quartz. Both enantiomorphs of the quartz can be used within the framework of the present invention, the transition from right to left quartz corresponding to a change in the $E_x$-field direction from "+x" to "−x". The following considerations and formulae relate to left quartz, which is provided with one or more complete optical fiber turns on its circumference. Partial turns are also possible.

Figure 1B:
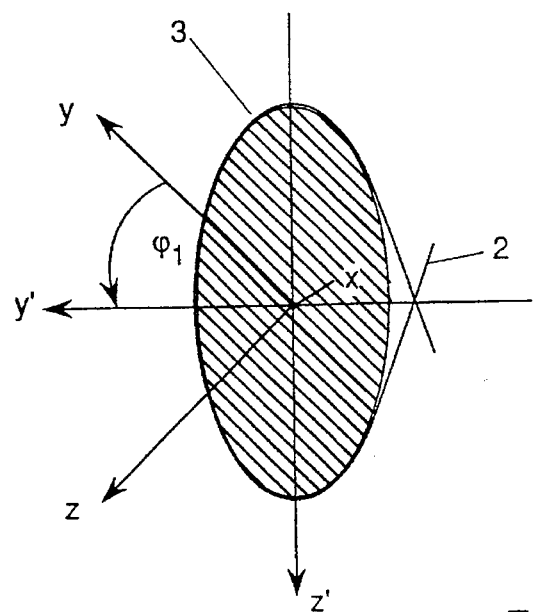

Referring now to the drawings, wherein like reference numerals designate identical or corresponding parts throughout the several views, as a first exemplary embodiment FIG. 1 shows a configuration having a quartz body 1 and an optical fiber 2, the quartz body 1 having the form of an elliptical disk and the optical fiber 2 being wound in at least one turn tightly around the lateral surface 3 of the disk. In accordance with the 1st exemplary embodiment of the invention, the disk faces are to be aligned perpendicular to the crystallographic x-axis of the quartz crystal on which the quartz body is based.

The circumference $U_0$ of an ellipse is given by the length of its two main axes $a_0$ and $b_0$:

$$U_O = \int_0^{2\pi} (a_0^2 \cdot \sin^2\theta + b_0^2 \cdot \cos^2\theta)^{0.5} d\theta, \quad (4)$$

where $\theta$ denotes an angle of integration.

Due to the piezoelectric effect, the length of the main axes changes to $a = a_0 \cdot (1 + s_{aa})$ and $b = b_0 \cdot (1 + s_{bb})$. The change in circumference amounts in the first order in the strains $s_{aa}$ and $s_{bb}$ to $$\Delta U = s_{aa} \cdot a_0^2 \int_0^{2\pi} \frac{\sin^2\theta \, d\theta}{(a_0^2 \cdot \sin^2\theta + b_0^2 \cdot \cos^2\theta)^{0.5}} + \quad (5)$$

$$s_{bb} \cdot b_0^2 \int_0^{2\pi} \frac{\cos^2\theta \, d\theta}{(a_0^2 \cdot \sin^2\theta + b_0^2 \cdot \cos^2\theta)^{0.5}}.$$

Figure 2:
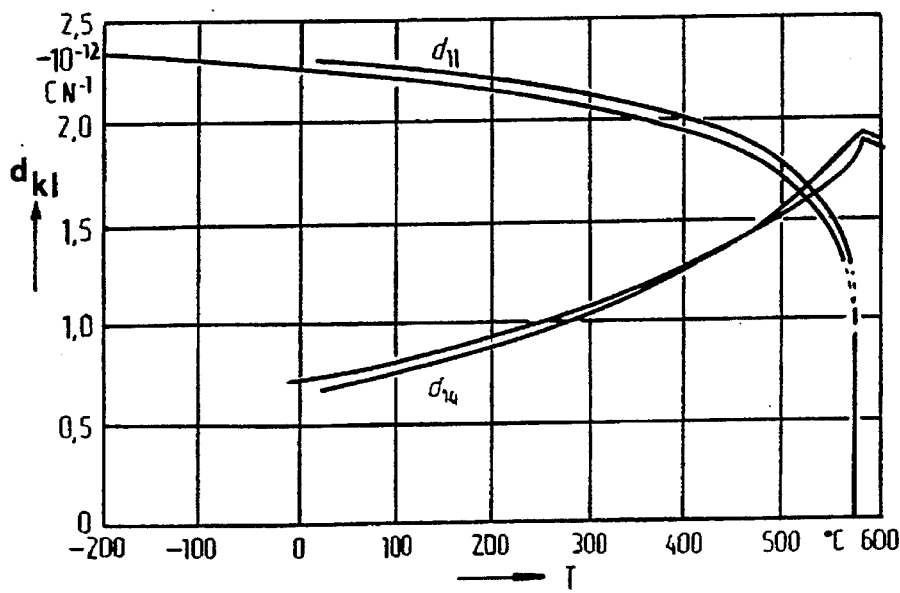
FIG. 2 shows a diagram of the temperature dependence of the independent piezoelectric coefficients $d_{11}$ and $d_{14}$ of α-quartz (left quartz)

$\Delta U$ is a linear function of $d_{11}$ and $d_{14}$, it being possible to write the temperature dependence of these coefficients, which is represented in the diagram of FIG. 2, approximately as $$d_{11} = d_{11}^{(0)} + d_{11}^{(1)} \cdot (T - 295\,K) + d_{11}^{(2)} \cdot (T - 295\,K)^2 + \ldots \quad (6)$$

$$d_{14} = d_{14}^{(0)} + d_{14}^{(1)} \cdot (T - 295\,K) + d_{14}^{(2)} \cdot (T - 295\,K)^2 + \ldots \quad (7)$$

The diagram of FIG. 2 is taken from the publication, mentioned at the beginning, by J. Tichy, G. Gautschi, "Piezoelektrische Messtechnik" ("Piezoelectric Metrology"), Springer Verlag Berlin, Heidelberg, New York, (1980), page 106, FIG. 6.4. It shows 2 measurement curves each for $d_{11}$ and $d_{14}$.

It is advantageous for the further considerations to define an effective piezoelectric coefficient in accordance with:

$$d_{eff}(T) = n \cdot \Delta U(T)/(n \cdot U_0 \cdot E) = d_{eff}^{(0)} + d_{eff}^{(1)} \cdot (T - 295K) + d_{eff}^{(2)} \cdot (T - 295K)^2 + \quad (8)$$

which is independent of the circumference $U_o$ of the ellipse and of the number n of turns of the optical fiber, $d_{eff}^{(0)}$, $d_{eff}^{(1)}$, $d_{eff}^{(2)}$ being the effective piezoelectric coefficients of 0th, 1st and 2nd order.

The aim below is to show how the size and the thermal characteristic of the $d_{eff}$ varies as a function of the choice of geometry, in particular with the ellipticity $\epsilon_0 = b_0/a_0$ and in the case of a rotation about the crystallographic x-axis.

The first step is to treat the angular dependence. If, starting from a consideration of an orientation of the elliptical quartz disk with the crystallographic z-axis along the major axis a and the crystallographic y-axis along the minor axis b, consideration is given to a rotation $$R_x(\phi) = \begin{matrix} 1 & 0 & 0 \\ 0 & \cos\phi & \sin\phi \\ 0 & -\sin\phi & \cos\phi \end{matrix} \quad (9)$$

of the coordinate axes about the x-axis by the angle $\phi$, it holds for an arbitrary E-field direction that $$s_{xx} = d_{11} \cdot E_1, \quad (10)$$

$$s_{y'y'} = (-\cos^2\phi \cdot d_{11} + \cos\phi \cdot \sin\phi \cdot d_{14}) \cdot E_x, \quad (11)$$

$$s_{z'z'} = (-\sin^2\phi \cdot d_{11} - \cos\phi \cdot \sin\phi \cdot d_{14}) \cdot E_x. \quad (12)$$

Only the $E_x$-field component can effect a piezoelectric deformation which can be detected by the optical fiber (2) and is described by the strain components $s_{y'y'}$ and $s_{z'z'}$, since the piezoelectric coefficients of the $E_y$- and the $E_z$-field components vanish for the strain components $s_{y'y'}$ and $s_{z'z'}$.

The result with $a_0 = z_0$, $b_0 = y_0$, $\epsilon_0 = b_0/a_0 < 1$, $s_{aa} = s_{z'z'}$, $s_{bb} = s_{y'y'}$:

$$d_{eff}(T) = (\alpha \cdot \cos 2\phi - 0.5) \cdot d_{11}(T) - (\alpha \cdot \sin 2\phi) \cdot d_{14}(T) = A \cdot d_{11} + B \cdot d_{14} \quad (13)$$

where $$\alpha(\epsilon_0) = (\epsilon_0^2 \cdot K/E - 1)/(\epsilon_0^2 - 1) - 0.5, \quad (14)$$

$$K = \int_0^{\pi/2} [1 - (1 - \epsilon_0^2) \cdot \sin^2\theta]^{-0.5} d\theta, \quad (15)$$

$$E = \int_0^{\pi/2} [1 - (1 - \epsilon_0^2) \cdot \sin^2\theta]^{0.5} d\theta. \quad (16)$$

It holds that $0 < \alpha < 0.5$ and thus that $-1 < A < 0$ and $-½ < B < ½$ as a function of $\phi$ and $\epsilon_0$. By choosing the angle of rotation and the ellipticity, the piezoelectric coefficients $d_{11}$ and $d_{14}$, and thus also respectively their temperature coefficients $d_{11}^{(i)}$ and $d_{14}^{(i)}$, can be mixed, specifically within the limits of $$0.5 \cdot \{-d_{11}^{(i)} - [d_{11}^{(i)2} + d_{14}^{(i)2}]^{0.5}\} < d_{eff}^{(i)} < 0.5 \cdot \{-d_{11}^{(i)} + [d_{11}^{(i)2} + d_{14}^{(i)2}]^{0.5}\}$$

where $i = 0, 1, 2, \ldots$. In particular, it can be provided that the effective piezoelectric temperature coefficient of 1st order $d_{eff}^{(1)}$ receives the same sign as the coefficient of 0th order $d_{eff}^{(0)}$.

Figure 3:
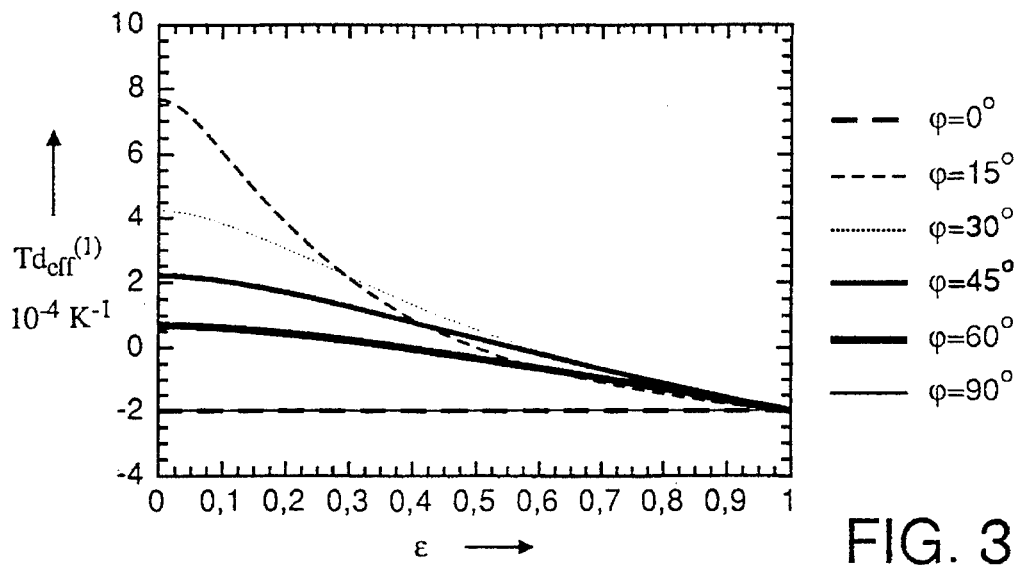
FIG. 3 shows a diagram of the relative temperature coefficient of first order $Td_{eff}^{(1)}$, as a function of the ratio $\epsilon$ of the minor axis to the major axis of the elliptical cross section of the quartz body of FIG. 1 for different angles $\phi$ of rotation of the minor axis of the ellipse with respect to the crystallographic y-axis of the quartz body.
Figure 4:
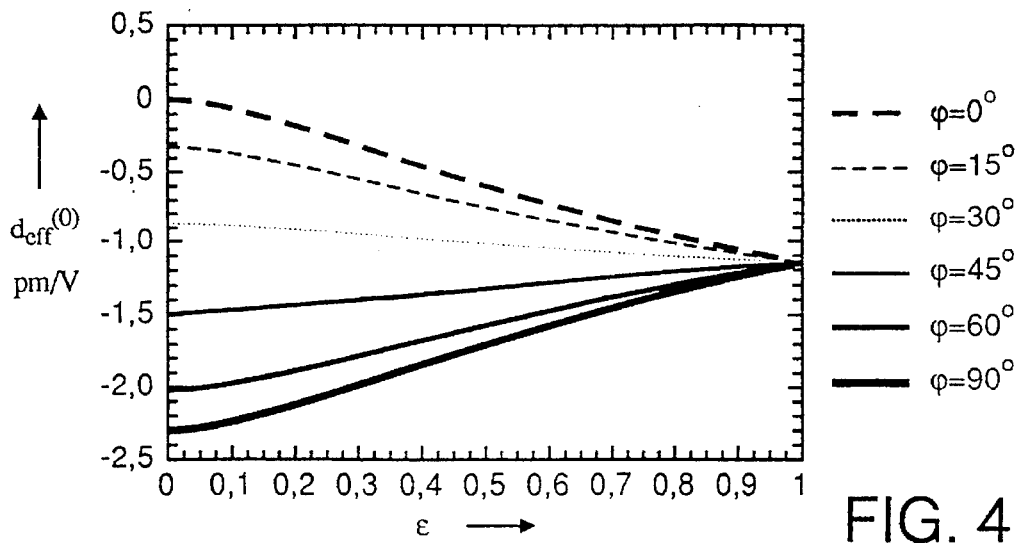
FIG. 4 shows a diagram of the effective piezoelectric coefficient of 0th order $d_{eff}^{(0)}$, belonging to FIG. 3, as a function of $\epsilon$ of the quartz body of FIG. 1 for the same angle $\phi$ of rotation of the minor axis of the ellipse with respect to the crystallographic y-axis of the quartz body.

FIG. 3 represents the relative temperature coefficient of first order $Td_{eff}^{(1)}$ in accordance with:

$$Td_{eff}^{(1)} = d_{eff}^{-1} \partial d_{eff}/\partial T|_{T=295K} = d_{eff}^{(1)}/d_{eff}^{(0)} \quad (17)$$

and FIG. 4 represents $d_{eff}^{(0)}$ as a function of the ellipticity for different angles of rotation. The values $d_{11}^{(0)}=2.3$ pm/V, $d_{11}^{(1)}=-4.531 \cdot 10^{-4}$ pm V$^{-1}$ K$^{-1}$, $d_{14}^{(0)}=0.68$ pm/V and $d_{14}^{(1)}=11.152 \cdot 10^{-4}$ pm V$^{-1}$ K$^{-1}$ were used for all the calculations.

Figure 5:
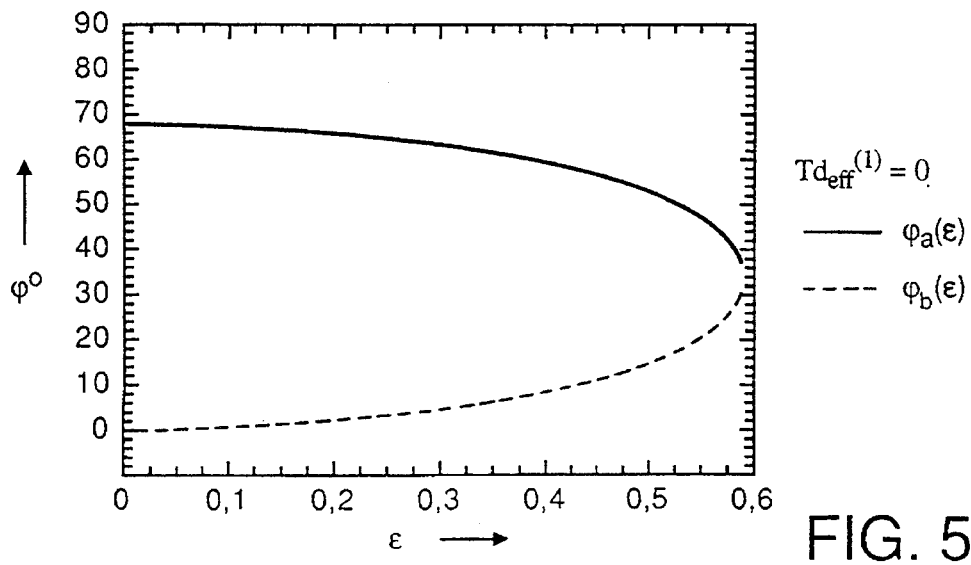
FIG. 5 shows a diagram of the combinations of $\phi$ and $\epsilon$ for which $Td_{eff}^{(1)}$ vanishes.

It may be seen from FIG. 3 that the relative temperature coefficient of first order $Td_{eff}^{(1)}$ can be varied within a wide range, preferably with the ellipticity $\epsilon_0$ in the range of $0.1 < \epsilon_0 < 0.9$ and the angle $\phi$ of rotation in the range of $10° < \phi < 80°$. $Td_{eff}^{(1)}$ can, in particular, be caused to vanish for a plurality of combinations of $\epsilon_0$ and $\phi$. The corresponding relationship between $\epsilon_0$ and $\phi$ is obtained for this case from $$d_{14}^{(1)}/d_{11}^{(1)} = -A/B \tag{18}$$

as $$\phi = 0.5 \cdot \arccos\{[1 \pm D \cdot [4 \cdot (D^2+1) \cdot \alpha^2 - 1]^{0.5}]/[2 \cdot (D^2+1) \cdot \alpha]\} \tag{19}$$

it being the case that $D = d_{14}^{(1)}/d_{11}^{(1)}$. Equation (19) has solutions only for $\epsilon_0 \leq 0.59$, specifically $\phi_a(\epsilon_0)$ and $\phi_b(\epsilon_0)$, which are represented in FIG. 5.

Figure 6:
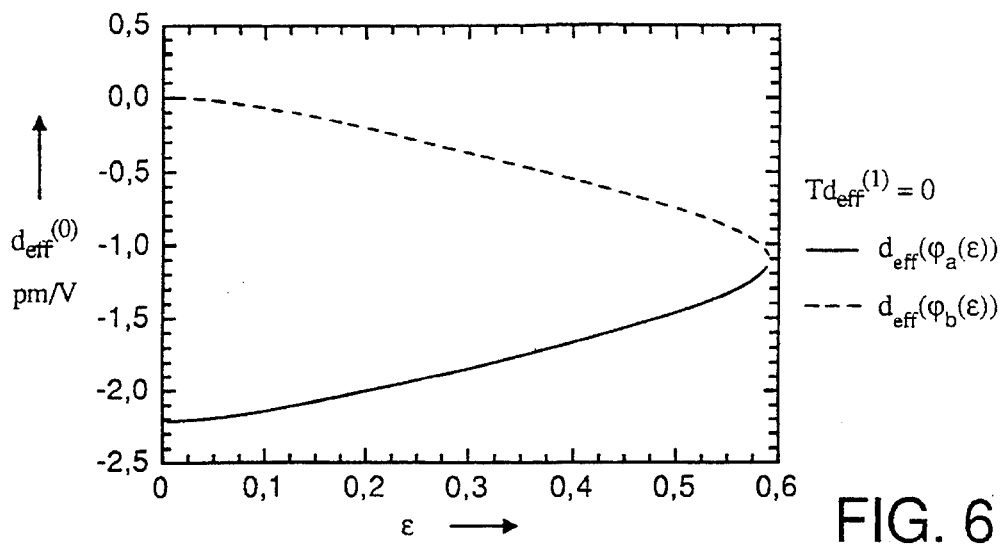
FIG. 6 shows a diagram of the associated effective piezoelectric coefficient of 0th order $d_{eff}^{(0)}$, as a function of $\epsilon$ of the quartz body of FIG. 1.

FIG. 6 shows the associated values of the coefficient $d_{eff}^{(0)}$, which is a measure of the absolute magnitude of the piezoelectric effect.

The decision in favor of a specific combination of $\epsilon_0$ and $\phi$ should in practice be taken in conjunction, in particular, with a consideration of the following two criteria:

The piezoelectric effect should be sufficiently large, so that an adequate signal is obtained interferometrically (for example $|d_{eff}^{(0)}| > 0.5$ pm/V).

The value $\epsilon_0$ should be as near as possible to 1, so that the force transmission from the elliptic quartz disk to the optical fiber is as uniform as possible.

It may be seen from FIGS. 5 and 6 that we obtain $Td_{eff}^{(1)} = 0$, for example for $\epsilon_0 \geq 0.4$ and $34° \leq \phi_a \leq 60°$, in particular for $\epsilon_0 = 0.59$ and $\phi_a = 34°$, $d_{eff}^{(0)}$ then assuming a value of $-1.1$ pm/V.

It is not desired in every case to cause the effective piezoelectric temperature coefficient of first order $d_{eff}^{(1)}$ to vanish, specifically not in the case when also the remaining components of the entire sensor structure cause a certain temperature dependence with respect to the measurement signal. In this case, it could be attempted by suitable choice of $\epsilon_0$ and $\phi$ for the entire sensor to realize a vanishing temperature coefficient. On the basis of empirical values from previously known sensors, for this purpose $Td_{eff}^{(1)}$ would need to have a value of approximately $+6 \cdot 10^{-4}$ K$^{-1}$. For the use, again, of equation (19), in which, however, it is necessary to substitute D with $$D' = (d_{14}^{(1)} - 6 \cdot 10^{-4} K^{-1} \cdot d_{14}^{(o)})/(d_{11}^{(1)} - 6 \cdot 10^{-4} K^{-1} \cdot d_{11}^{(o)}) \tag{20}$$

it is possible to calculate the combinations of $\epsilon_0$ and $\phi$ for which $Td_{eff}^{(1)}$ receives precisely this value.

Figure 7:
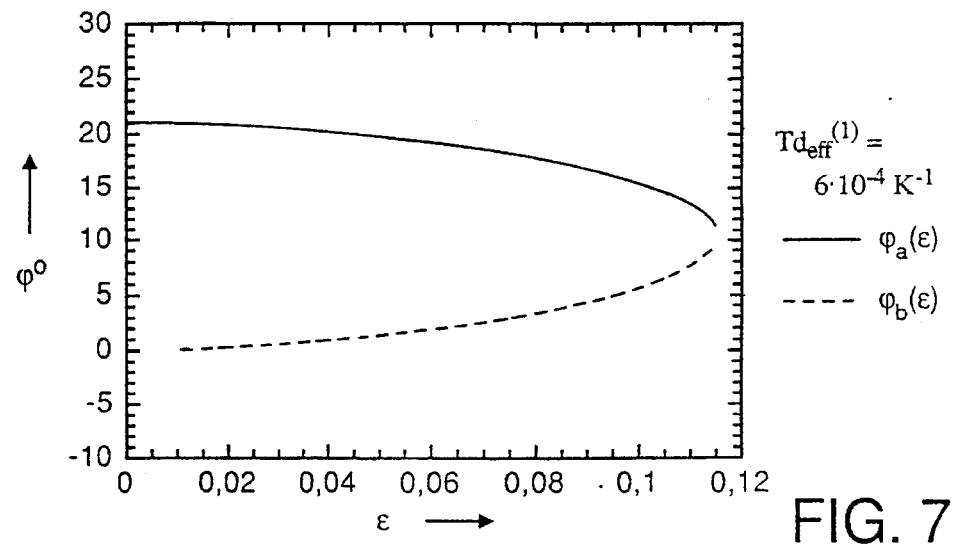
FIG. 7 shows a diagram of the combinations of $\phi$ and $\epsilon$ for which $Td_{eff}^{(1)}$ assumes a value of $+6 \cdot 10^{-4}$ $K^{-1}$.
Figure 8:
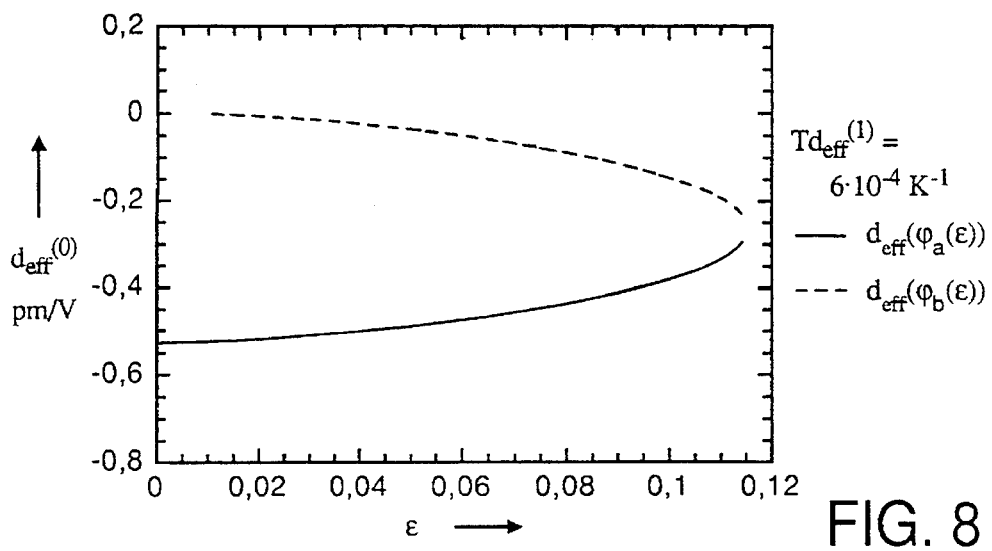
FIG. 8 shows a diagram of the associated characteristic of $d_{eff}^{(0)}$, as a function of $\epsilon$ of the quartz body of FIG. 1.

Solutions $\phi_a(\epsilon_0)$ and $\phi_b(\epsilon_0)$ exist only for $\epsilon_o < 0.115$; they are represented in FIG. 7. FIG. 8 shows the associated values for $d_{eff}^{(0)}$.

Here, too, it is necessary again to make the compromise previously mentioned, although $\epsilon_0$ would have to be chosen, for example as 0.04 so that the value of $d_{eff}^{(0)}$ does not become smaller than 0.5 pm/V.

By suitable choice of the previously discussed parameters, it is possible to achieve further special and, as the case may be, desired effects. One of these effects could, for example, consist in that only the quadratic term $d_{eff}^{(2)}$ is caused to vanish. The result is then a temperature dependence of the piezoelectric effect which is linear except for terms of 3rd and higher order.

Figure 9:
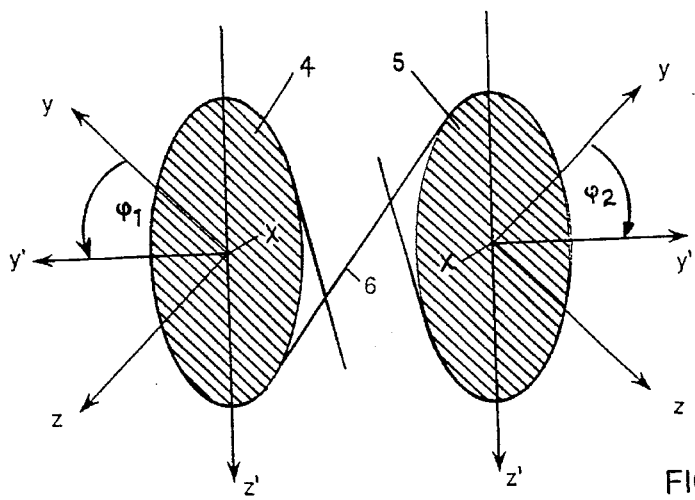
FIG. 9 shows two cylindrical quartz bodies of elliptical cross section in accordance with a second embodiment of the invention.

As a further exemplary embodiment, a configuration is now considered as shown in FIG. 9, which has two quartz bodies 4 and 5 and an optical fiber 6, the two quartz bodies having the form of an elliptical disk, and the optical fiber 6 being wound around the lateral surface of both disks in at least one turn in each case. The two disk faces are to be aligned perpendicular to the crystallographic x-axis of the quartz crystals respectively forming the basis of the quartz bodies. With respect to the electric field E, the two quartz bodies are to be arranged with opposing orientation of the crystallographic x-axis. It then holds that:

$$d_{eff}(T)_{2ellipses} = d_{eff}(\epsilon_1, \phi_1)/(1+M) - M \cdot d_{eff}(\epsilon_2, \phi_2)/(1+M) \tag{23}$$

the indices 1, 2 relating to the two elliptical quartz bodies 5, 6, $n_1$ and $n_2$ denoting the number of the turns of the optical fiber on the individual quartz bodies, and it being necessary to take $M = n_2/n_1$ and $d_{eff}(\epsilon, \phi)$ from the equations (13)–(16). Since $d_{eff}$ again has the form $A' \cdot d_{11} + B' \cdot d_{14}$, $A'$ and $B'$ being functions of $\epsilon_1$, $\phi_1$, $\epsilon_2$, $\phi_2$ and M, what has been said above for only one elliptical quartz body holds analogously. In particular, the effective piezoelectric temperature coefficient of 1st order $d_{eff}^{(1)}{}_{2\,ellipses}$ can now be varied within the wider limits $$-0.5 \cdot [d_{11}^{(1)2} + d_{14}^{(1)2}]^{0.5} < d_{eff}^{(1)}{}_{2ellipses} \leq 0.5 \cdot \{-d_{11}^{(1)} + [d_{11}^{(1)2} + d_{14}^{(1)2}]^{0.5}\}$$

Figure 10:
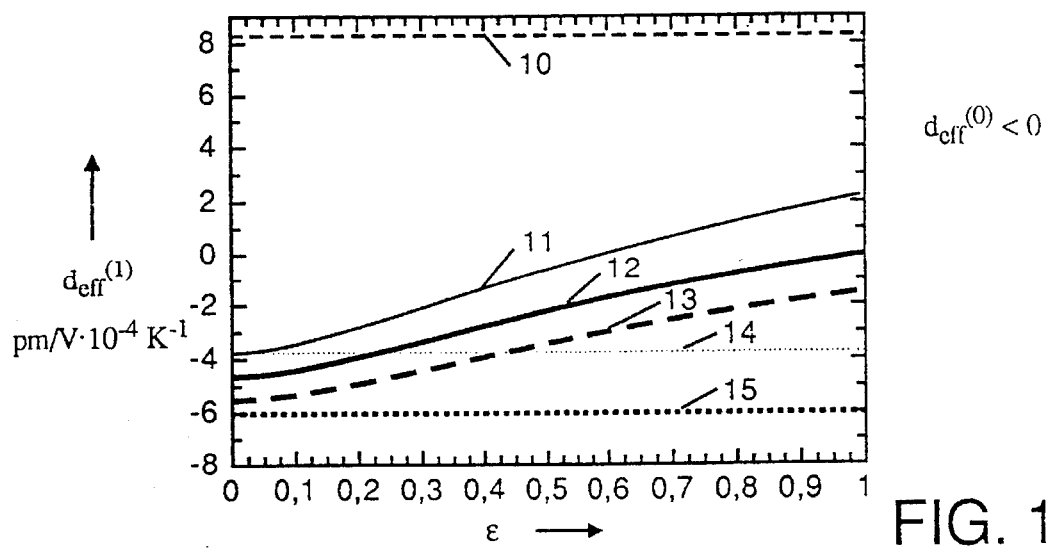
FIG. 10 shows $d_{eff}^{(1)}$ as a function of $\epsilon$ of the two elliptical quartz bodies of FIG. 9 for a plurality of combinations of turn ratios M and angles $\phi_1$ and $\phi_2$ of rotation of in each case the minor axis with respect to the crystallographic y-axis of the quartz body.

Furthermore, the use of two elliptical quartz bodies has practical advantages:

(i) The relative temperature coefficient of 1st order $Td_{eff}^{(1)}$ can be chosen to be more strongly positive even at a lower ellipticity ($\epsilon$ closer to 1). In FIG. 10, $d_{eff}^{(1)}$ is represented as a function of $\epsilon$ for various cases. The curves 10, 11 and 14 relate to an elliptical quartz cylinder 1 in accordance with the 1st embodiment of the invention. Curve 10 represents an upper limit for $d_{eff}^{(1)}$, and curve 14 a lower limit, which can be achieved by varying $\phi$ and $\epsilon$. In curve 11, the parameter $\phi$ has a value of 34°. The curves 12, 13 and 15 relate to 2 elliptical quartz cylinders 4 and 5. Curve 12 shows $d_{eff}^{(1)}$ as a function of $\epsilon$ for the parameters $\phi_1 = 45°$, $\phi_2 = -30°$, $\epsilon_1 = \epsilon_2 = \epsilon$ and M=1 and curve 13 for the parameters $\phi_1 = 45°$, $\phi_2 = -30°$, $\epsilon_1 = \epsilon_2 = \epsilon$ and M= 5. Curve 15 shows the lower limits for $d_{eff}^{(1)}$, which can be achieved by varying the parameters $\phi_1$, $\phi_2$, $\phi_1$, $\phi_2$ and M.

Figure 11:
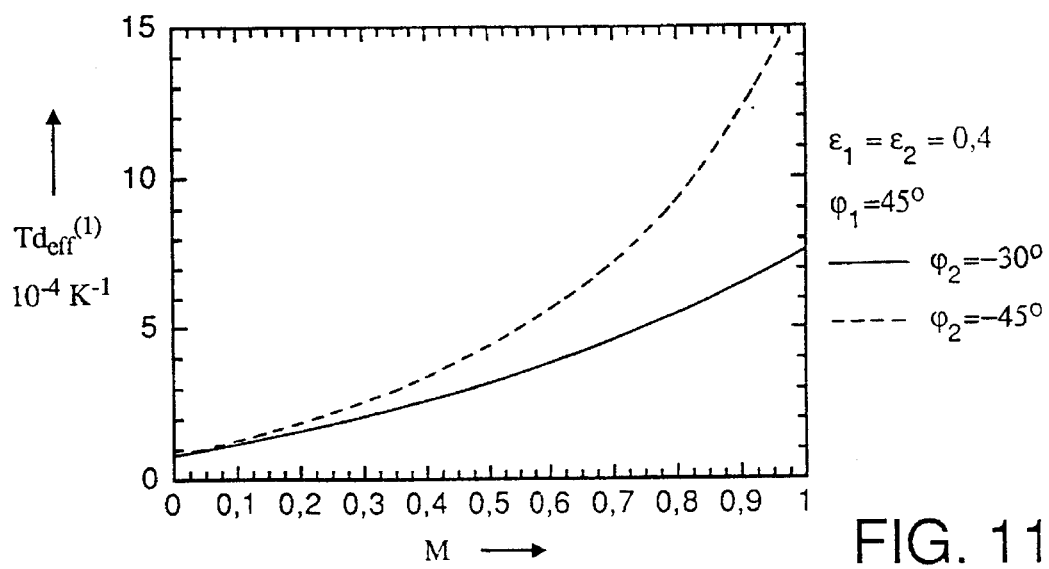
FIG. 11 shows $Td_{eff}^{(1)}$ as a function of the turn ratio M of the optical fibers of the two quartz bodies of FIG. 9 for two combinations of $\phi_1$ and $\phi_2$ and $\epsilon_1 = \epsilon_2 = 0.4$.
Figure 12:
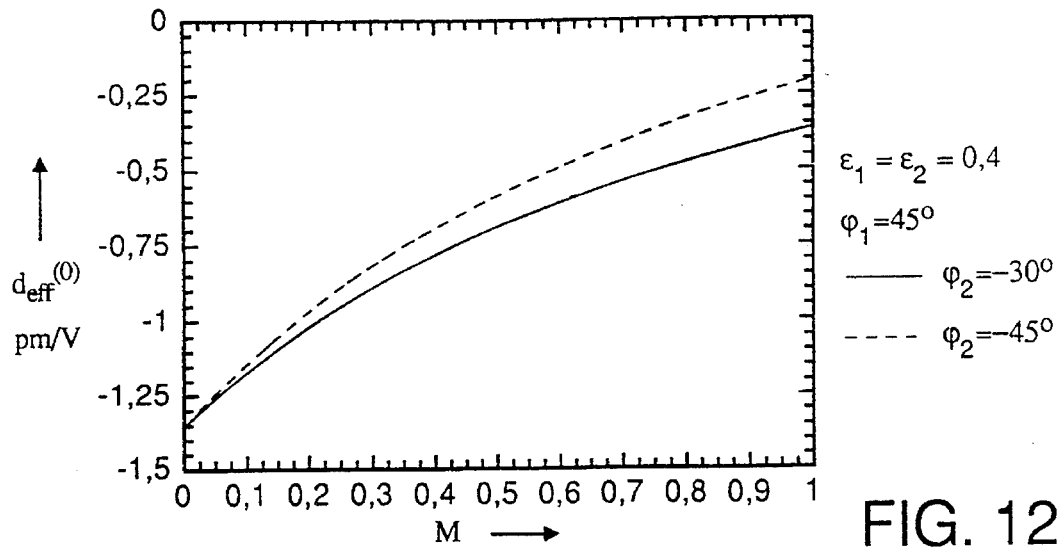
FIG. 12 shows $d_{eff}^{(0)}$ as a function of M for the same combinations of $\phi_1$ and $\phi_2$ and, again, $\epsilon_1 = \epsilon_2 = 0.4$.

(ii) The temperature coefficient can also be influenced by additionally varying the turn ratio in a simple way. FIG. 11 shows the dependence of $Td_{eff}^{(1)}$ on the turn ratio M for two angle combinations. FIG. 12 shows the dependence of $d_{eff}^{(0)}$ on M for the same parameters.

This arrangement of FIG. 9 with 2 quartz bodies 4, 5 with opposing directions of the x-axes in a parallel electric field has an equivalent in an arrangement with the same directions of the x-axes in 2 antiparallel electric fields. It is, furthermore, assumed for equation (23) that a voltage of the same magnitude is applied to the two quartz cylinders.

Three special cases are to be considered below in order to illustrate the 2nd embodiment of the invention:

(i) $\epsilon_1 = \epsilon_2$, $\phi_1 = -\phi_2$, M=1. In this case, the contributions of $d_{11}$ cancel out completely and all that remains is the (strongly positive) temperature coefficient of $d_{14}$:

$$d_{eff}(T)_{2ellipses} = -\alpha \cdot \sin(2 \cdot \phi_1) \cdot d_{14}(T) \tag{24}$$

The achievable piezoelectric effect is, however, small in absolute terms: with $\phi_1 = 45°$, $\epsilon_1 = \epsilon_2 = 0.4$ (realistic), $d_{eff}^{(0)} = -0.2$ pm/V. With $\epsilon_1 = \epsilon_2 = 0.1$ (unrealistic), $d_{eff}^{(0)} = -0.32$ pm/V. For comparison: in the case of only one elliptical quartz body, $d_{eff} \approx d_{14}$ occurs only for $\epsilon \to 0$.

However, by admixing $d_{11}$ it is possible again to achieve effects of the previous order of magnitude of $d_{eff}^{(0)} \approx -$ $0.5 \cdot d_{11}^{(0)}$. In practice, it is, as already mentioned, desirable to choose the ellipticity as near to 1 as possible, in order to achieve as uniform a take-up and transmission of force onto the fiber as possible. The turn ratio M should also be near to 1, in order to be able to realize as many turns as possible in the case of quartz bodies of equal thickness. Furthermore, ellipses of identical size and shape ($\epsilon_1 = \epsilon_2$) are preferred. Consequently, let it be assumed below that it is always the case that $\epsilon_1 = \epsilon_2 = \epsilon < 1$ and $M = < 1$. The parameters $\phi_1$ and $\phi_2$ as well as $\epsilon$ and M remain capable of being chosen arbitrarily within certain limits, in order to optimize the size and the thermal characteristic of the piezoelectric effect. It is advantageous to choose $\phi_1 > 0$ and $\phi_2 < 0$ for vanishing or positive temperature coefficients.

Figure 13:
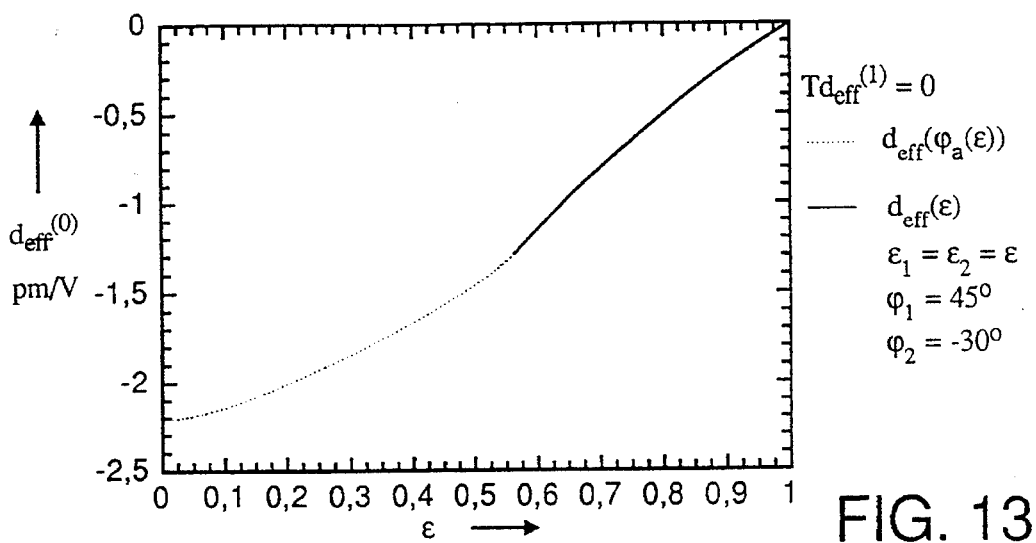
FIG. 13 shows $d_{eff}^{(0)}$ as a function of $\epsilon$ for the case in which $Td_{eff}^{(1)}$ vanishes, the choice having been made that $\phi_1 = 45°$, $\phi_2 = -30°$ and $\epsilon_1 = \epsilon_2 = \epsilon$ and it being necessary to take M ($\epsilon$) from FIG. 14 (the case of an ellipse in accordance with FIG. 6 being shown in dots for comparison)
Figure 14:
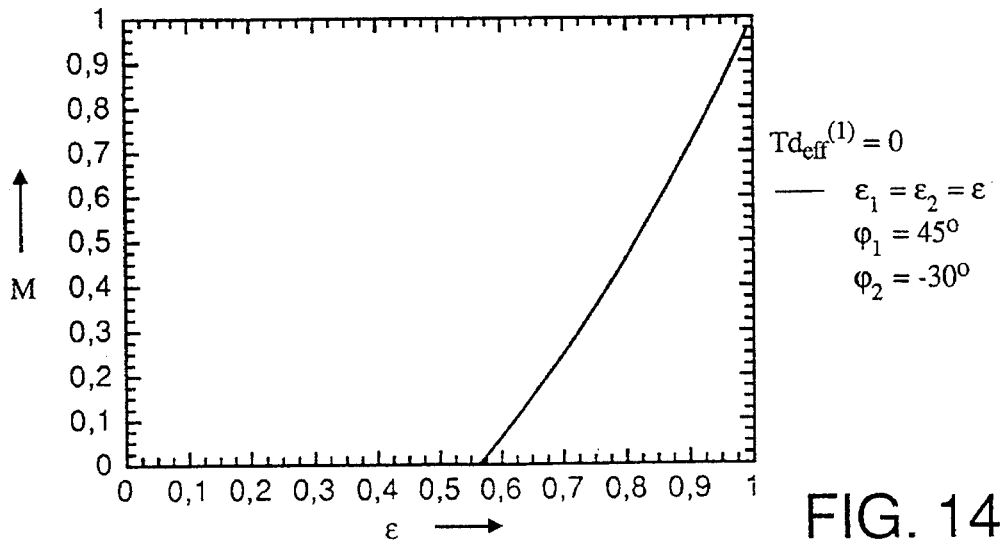
FIG. 14 shows the dependence of M on $\epsilon$ with reference to parameters of FIG. 13.

(ii) $Td_{eff}^{(1)} = 0$. It is then possible to represent M as a function of $\phi_1$ and $\phi_2$ as well as $\epsilon$ and thus to find $d_{eff}^{(0)}(\epsilon, \phi_1, \phi_2)$. $d_{eff}^{(0)}$ is largest in terms of absolute value for $\phi_1 \approx +45°$ and $\phi_2 \approx -45°$, deviations by $\pm 10°$ having no essential influence. In the case of $\phi_1 = +45°$ and $\phi_2 = -30°$, it is possible both to make $d_{eff}^{(0)}$ large and to choose $\epsilon$ and M near to 1. In FIGS. 13 and 14, the corresponding dependences of $d_{eff}^{(0)}$ and M are represented graphically in FIGS. 13 and 14. For comparison, the curve produced for only one elliptical quartz body is illustrated in FIG. 15.

Figure 15:
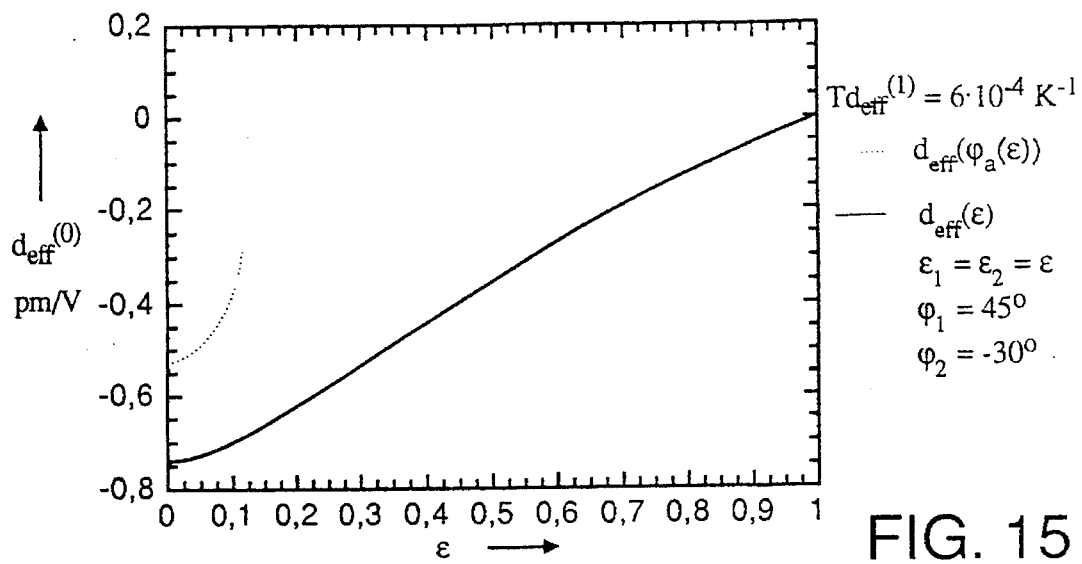
FIG. 15 shows $d_{eff}^{(0)}$ as a function of $\epsilon$ for the case in which $Td_{eff}^{(1)}$ assumes a value of $+6 \cdot 10^{-4}$ $K^{-1}$, for $\phi_1 45°$, $\phi_2 = -30°$; the choice having been made that $\epsilon_1 = \epsilon_2 = \epsilon$, and it being necessary to take M ($\epsilon$) from FIG. 16.
Figure 16:
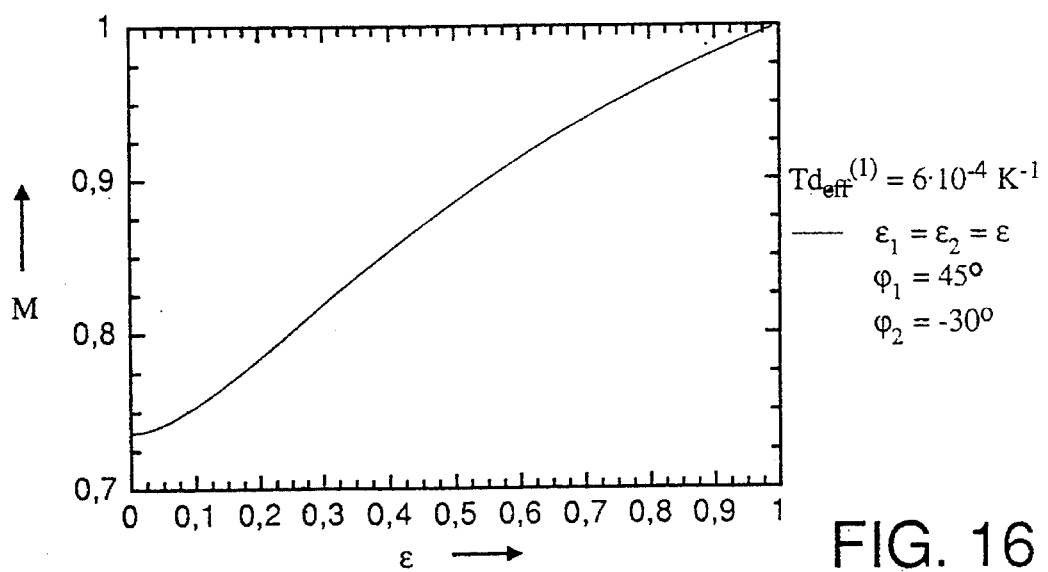
FIG. 16 shows the dependence of M on $\epsilon$ with reference to parameters of FIG. 15.

(iii) FIGS. 15 and 16 show the same dependences as FIGS. 13 and 14, but for the case $Td_{eff}^{(1)} = +6 \cdot 10^{-4} K^{-1}$.

Figure 17:
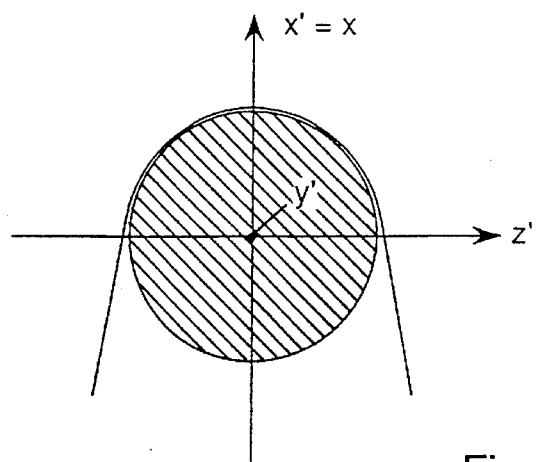
FIG. 17 shows a quartz body, which is constructed as a disk and contains the crystallographic x-axis in its disk plane, in accordance with a third embodiment of the invention.

A round quartz disk 7 in accordance with FIG. 17, which contains the crystallographic x-axis and the E-field (parallel to x) to be measured may be considered as a third exemplary embodiment.

Here, the rotation $R_x(\phi)$ leads to $$d_{eff}(T) = 0.5 \cdot (1 + \cos 2\phi) \cdot d_{11}(T) - 0.5 \cdot (\sin 2\phi) \cdot d_{14}(T) \quad (25)$$

Two special cases are to be considered in more detail:

(i) $d_{eff}^{(1)} = 0$, that is to say vanishing temperature coefficient. This leads to $$d_{11}^{(1)}/d_{14}^{(1)} = \tan(\phi). \quad (26)$$

It follows from this that: $\phi = -22.1°$ and $d_{eff}^{(0)} = 2.21$ pm/V.

(ii) $d_{eff}^{(1)} = max.$, that is to say maximum temperature coefficient of 1st order. This leads to $$d_{14}^{(1)}/d_{11}^{(1)} = -\tan(2\phi). \quad (27)$$

It follows from this that: $\phi = -56.1°$, $d_{eff}^{(0)} = +1.03$ pm/V and $d_{eff}^{(1)}/d_{eff}^{(0)} = +3.65\%/100K$.

Figure 18:
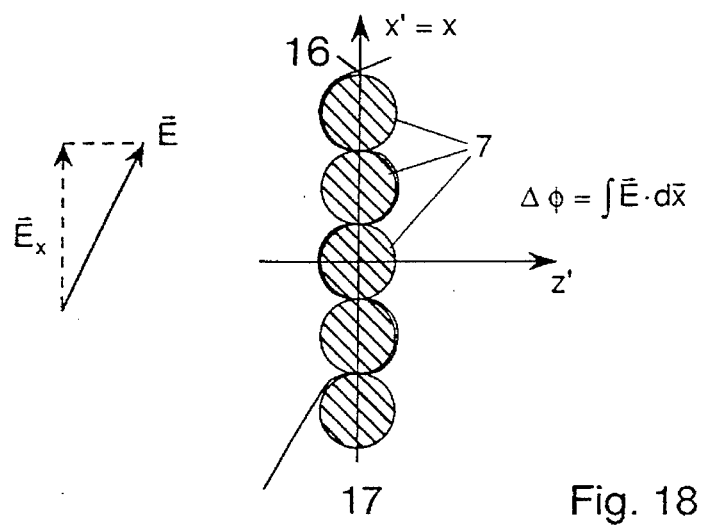
FIG. 18 shows a plurality of quartz bodies of a type of FIG. 17, arranged in a line for linear integral measurement of the electric field.

The advantages of this third embodiment reside, chiefly, in that the production of elliptical quartz bodies is eliminated, and that the arrangement is sensitive only to the $E_x$-field component. By sequentially arranging a plurality of identical quartz bodies 7, as shown in FIG. 18, it is then possible to approximate the line integral of the electric field. In this case, the x-axis on each quartz body (7) must be orientated tangentially relative to the integration path between 2 points (16, 17) in the electric field, between which the electric voltage is to be measured. However, it is rather to be regarded in this embodiment as disadvantageous that the E-field to be measured lies in the plane of the disk of the quartz body. It is therefore also impossible to apply the E-field via electrodes, and moreover field distortions occur.

Figure 19:
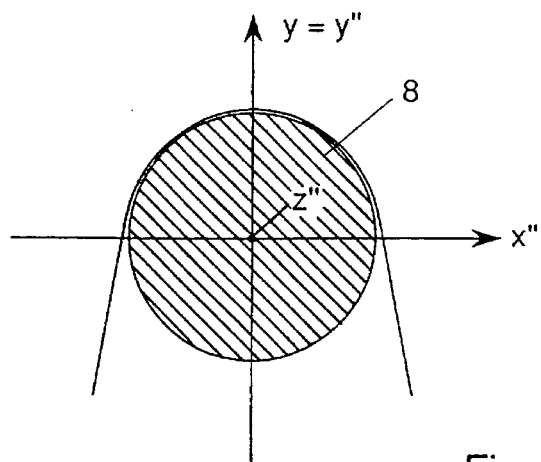
FIG. 19 shows a quartz body which is constructed as a circular disk and contains in its disk plane the crystallographic y-axis as well as the components of the E-field which are to be measured, in accordance with a fourth embodiment of the invention.

A round quartz disk 8 which in accordance with FIG. 19 contains both the crystallographic y-axis and the E-field to be measured is to be considered as a fourth exemplary embodiment.

With the aid of a rotation $$R_y(\gamma) = \begin{matrix} \cos \gamma & 0 & \sin \gamma \\ 0 & 1 & 0 \\ -\sin \gamma & 0 & \cos \gamma \end{matrix} \quad (28)$$

of the coordinate axes about the y-axis by the angle $\gamma$, the following piezoelectric strains are obtained for an arbitrary E-field direction $$s_{x'x'} = 32 \, d_{11} \cos^2 \gamma \cdot (\cos \gamma \cdot E_1' - \sin \gamma \cdot E_3') - d_{14} \cdot \cos \gamma \cdot \sin \gamma \cdot E_2' \quad (29)$$

$$s_{y'y'} = -d_{11} \cdot (\cos \gamma \cdot E_1' - \sin \gamma \cdot E_3') \quad (30)$$

$$s_{z'z'} = d_{11} \cdot \sin^2 \gamma \cdot (\cos \gamma \cdot E_1' - \sin \gamma \cdot E_3') + d_{14} \cdot \cos \gamma \cdot \sin \gamma \cdot E_2'. \quad (31)$$

The result for E-fields whose $E_2'$ component does not vanish is again a mixture of $d_{11}$ and $d_{14}$. In this case, contributions of $d_{11}$ and $d_{14}$ belong to orthogonal E-field components, with the result that the temperature dependence of the piezoelectric effect varies with the E-field direction. This could well be rather undesired for applications.

Finally, a cylindrical quartz body having an optical fiber wound obliquely with respect to the cylinder axis may also further be mentioned as an embodiment which is likewise possible in principle, the direction of the applied E-field deviating from the direction of the cylinder axis of the quartz body.

Other attachments of the optical fibers (2, 6) and shapes of the quartz body are also possible such that the two piezoelectric coefficients $d_{11}$ and $d_{14}$ contribute to the strain of the optical fiber in such a way that their temperature dependences compensate one another at least partially. In particular, it is possible, for example, to attach a fiber along a straight line on a quartz platelet which is sectioned perpendicular to the x-axis, the straight line extending at an angle $\psi$ relative to the crystallographic y-axis. The result is then an effective piezoelectric coefficient $$d_{eff}(T) = -\cos^2 \psi \cdot d_{11}(T) + \sin(2\psi) \cdot d_{14}(T).$$

Of the embodiments explained above, the 1st and 2nd, in which one or two elliptical quartz disks are respectively used perpendicular to the crystallographic x-axis, are to be regarded as preferred.

It is particularly advantageous when the optical fiber (2, 6) has a polyamide cladding, since such an optical fiber does not cause any appreciable contribution to the temperature dependence of the measurement signal.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A fiber-optic sensor for measuring electric field strengths or voltages,
   a) comprising at least one quartz body made from a quartz crystal with piezoelectric coefficients $d_{11}$ and $d_{14}$ and with mutually orthogonal crystallographic main axes x, y, z which form a right-handed coordinate system,
   b) the z-axis being a threefold optical axis, in whose direction the polarization plane of a linearly polarized light is rotated, in the case of a direction of view opposing the direction of propagation of said light, counterclockwise in the case of left quartz and clockwise in the case of right quartz, c) the x-axis denoting one of 3 twofold electric axes and the positive x-direction being oriented such that in the case of a tensile strain of a left quartz in the direction of this x-axis a positive charge occurs, and in the case of a right quartz a negative charge occurs on a surface perpendicular to the x-axis due to the piezoelectric effect, d) the y-axis being the so-called mechanical axis, e) at room temperature the piezoelectric coefficients of 0th order, represented as $d_{11}^{(0)}$ and $d_{14}^{(0)}$ are $d_{11}^{(0)}>0$ and $d_{14}^{(0)}>0$ for the left quartz, and $d_{11}^{(0)}<0$ and $d_{14}^{(0)}<0$ for the right quartz, f) the temperature coefficients of 1st order of the piezoelectric coefficients, represented as $d_{11}^{(1)}$ and $d_{14}^{(1)}$, being $d_{11}^{(1)}<0$ and $d_{14}^{(1)}>0$ for left quartz and $d_{11}^{(1)}>0$ and $d_{14}^{(1)}<0$ for right quartz, g) having at least one optical fiber which is attached to the quartz body over a prescribable section or a length of the quartz body in such a way that in the dimensioning of the quartz-body changes in length are transmitted to the optical fibers, wherein h) the temperature coefficients of 1st order of the piezoelectric coefficients $d_{11}^{(1)}$ and $d_{14}^{(1)}$ of the quartz body are combined proportionally in accordance with $d_{\text{eff}}^{(1)}= A \cdot d_{11}^{(1)}+B \cdot d_{14}^{(1)}$, in such a way that a change in length of the optical fiber which is effected by the piezoelectric coefficients of 0th order $d_{11}^{(0)}$ and $d_{14}^{(0)}$ and is proportional to $d_{\text{eff}}^{(0)}=A \cdot d_{11}^{(0)} +B \cdot d_{14}^{(0)}$, and/or an optical measurement signal due to this sensor, are at least approximately independent of temperature, $d_{\text{eff}}^{(0)}$ is effective piezoelectric coefficient, $d_{\text{eff}}^{(1)}$ is associated temperature coefficient for the strain of the quartz body along the support surface of the optical fiber, and A, B are parameters which depend on the shape of the at least one quartz body relative to the crystallographic axes and/or on the length and position of the at least one length of the optical fiber which is codected to the at least one quartz body.

2. The fiber-optic sensor as claimed in claim 1, wherein a) a quartz body is provided which has the shape of a disk, b) only the crystallographic x-axis of the quartz crystal forming the basis of the quartz body lies in the plane of the disk of the quartz body.

3. The fiber-optic sensor as claimed in claim 2, wherein a) a quartz body is provided which has the shape of a disk with a circular cross section, and b) $A=0.5 \cdot (1+\cos 2\phi)$ and $B=-0.5 \cdot (\sin 2\phi)$.

4. The fiber-optic sensor as claimed in claim 2, wherein a) a plurality of quartz bodies are provided in a row along the integration path of the line integral for the purpose of measuring the line integral of an electric field between two points, b) the x-axis of each quartz body is orientated tangentially relative to the integration path between the 2 points, and c) each quartz body supports the same number of turns of an optical fiber.

5. The fiber-optic sensor as claimed in claim 1, wherein a) the quartz body has a plane face whose face vector is orientated parallel to the crystallographic x-axis, b) an optical fiber is attached to the plane quartz face along a straight line which extends at an angle $\psi$ relative to the crystallographic y-axis, where c) $A=-\cos^2 \psi$ and $B=\sin (2 \cdot \psi)$.

6. The fiber-optic sensor as claimed in claim 1, wherein the optical fiber has a polyamide cladding.

7. The fiber-optic sensor as claimed in claim 1, wherein a) the cylinder axis of the quartz body is orientated in the direction of the x-axis, b) in the y/z-plane the quartz body has an elliptical cross section with 2 main axes of the cross-sectional ellipse, where $\epsilon 0=$ratio of minor to major axes of the ellipse in the case of an electric field, c) the minor axis of the ellipse has an angle of rotation with the y-axis of the quartz body, and d) it holds that $A=\alpha \cdot \cos(2 \cdot \phi)-0.5$ and $B=-\alpha \cdot \sin(2 \cdot \phi)$ where, for an electric field vector E, values of $\alpha$, K and E are:

$$\alpha(\epsilon_0) = (\epsilon_0^2 \cdot K/E - 1)/(\epsilon_0^2 - 1) - 0.5,$$

$$K = \int_0^{\pi/2} [1 - (1 - \epsilon_0^2) \cdot \sin^2 \theta]^{-0.5} d\theta,$$

$$E = \int_0^{\pi/2} [1 - (1 - \epsilon_0^2) \cdot \sin^2 \theta]^{0.5} d\theta.$$

8. The fiber-optic sensor as claimed in claim 7, wherein a) the ratio $\epsilon 0$ of the minor to major axes of the ellipse is in the range of $0.1<\epsilon 0<0.9$ and b) the angle $\phi$ of rotation is in the range of $10°<\phi< 80°$.

9. The fiber-optic sensor as claimed in claim 7 wherein a) $d_{\text{eff}}^{(1)}=0$ is chosen, $\epsilon o$ and $\phi$ fulfilling the relationship:

$$\phi=0.5 \cdot \arccos \{(1 \pm D \cdot (4 \cdot (D^2+1) \cdot \alpha^2-1)^{0.5})/(2 \cdot (D^2+1) \cdot \alpha)\}$$

where $$D=d_{14}^{(1)}/d_{11}^{(1)}$$

b) in particular, $\epsilon 0 \geq 0.4$ and $34°<\phi<60°$.

10. The fiber-optic sensor as claimed in claim 1, wherein a) 2 quartz bodies are provided whose cylinder axes are orientated in the direction of the x-axis, b) in the y/z-plane the quartz bodies have an elliptical cross section with respectively 2 main axes of the cross-sectional ellipses, where $\epsilon=$ratio of minor to major axes of the ellipses, where $\epsilon_i=$ratio of minor to major axes of the ellipse in the case of an electric field, c) the minor axis of the ellipse has an angle of rotation $\phi i$ with the y-axis of the respective quartz body, d) it holds that $A=A_1/(1+M)=A_2 \cdot M/(1+M)$ and $$B=B_1/(1+M)=B_2 \cdot M/(1+M)$$

where:

$$A_i = E_i \cdot \cos(2 \cdot \phi_1) - 0.5$$
$$B_i = -\alpha_i \cdot \sin(2 \cdot \phi_i)$$
$$\alpha_i = (\epsilon_i^2 \cdot K/E - 1)/(\epsilon_i^2 - 1) - 0.5,$$

$$K_i = \int_0^{\pi/2} (1 - (1 - \epsilon_i^2) \cdot \sin^2 \theta)^{-0.5} d\theta,$$

-continued $$E_i = \int_0^{\pi/2} (1 - (1 - \epsilon_i^2) \cdot \sin^2 \theta)^{0.5} d\theta,$$

it being the case that it is necessary to set i=1 for values of a 1st quartz body and i=2 for values of a 2nd quartz body and that M denotes the ratio of the number of fibers turns of the 2nd to the 1st quartz bodies, e) the two quartz bodies are orientated with their x-axes antiparallel relative to one another and f) in particular, the angles ($\phi 1$, $\phi 2$) of rotation have opposite signs.

* * * * *